United States Patent [19]

Belanger, Jr.

[11] Patent Number: 5,206,795
[45] Date of Patent: Apr. 27, 1993

[54] COMPLIANT CONNECTION FOR SUBSTRATES

[75] Inventor: Thomas D. Belanger, Jr., Saline, Mich.

[73] Assignee: AG Communication Systems Corporation, Phoenix, Ariz.

[21] Appl. No.: 814,645

[22] Filed: Dec. 30, 1991

[51] Int. Cl.⁵ .............................................. H05K 1/00
[52] U.S. Cl. ................................... 361/398; 361/400; 361/412; 361/413; 174/255
[58] Field of Search .............. 361/392, 398, 400, 403, 361/412, 413; 174/252, 253, 254, 255; 439/77

[56] References Cited

U.S. PATENT DOCUMENTS 2,823,371  2/1958  Jones ..................................... 361/392

Primary Examiner—Leo P. Picard
Assistant Examiner—Young S. Whang
Attorney, Agent, or Firm—Robert J. Black; Gregory G. Hendricks

[57] ABSTRACT

An electrical substrate including a flexible printed circuit mounted on the substrate arranged to provide electrical contact between the flexible printed circuit and circuit contacts on an associated carrier substrate. Portions of the flexible printed circuit extended from the top surface of the electrical substrate to the bottom of the substrate by way of recesses included in the geometry of the electrical substrate. Portions of the flexible printed circuit are folded under the bottom side of the electrical substrate and fastened thereto by some compliant material. Properly positioned, electrical contact is established between the flexible printed circuit and circuit contacts on the carrier substrate.

8 Claims, 1 Drawing Sheet

COMPLIANT CONNECTION FOR SUBSTRATES

BACKGROUND OF THE INVENTION

1. Field of the Invention

This inventions relates in general to modular electronic circuit devices and more particularly an arrangement for electrically connecting electrical substrates to a carrier substrate.

2. Background Art

In the past few years the use of plug-in units for electrical components has found favor within the electronics industry. Such plug-in units generally comprise a structure upon which are mounted electrical assemblies or subassemblies. The structure being arranged to be plugged into a suitable socket provided on a base chassis. When so plugged the components carried by the plug-in unit are electrically connected in proper circuit relation to other electrical equipment carried by the base chassis.

It is therefore an object of the present invention to provide an entirely new structure for electrically connecting electronic substrates onto carrier substrates.

Techniques for mounting electrical substrates to carrier substrates and providing electrical connection therewith are shown by my U.S. Pat. Nos. 4,755,906 and 4,755,907. These patents teach the use of a pair of guide rails mounted on a carrier substrate which accepts an electrical substrate in an arrangement where electrical connecting devices mounted transversely on the bottom surface electrical substrate are placed in contact with electrical connecting devices mounted directly to the carrier substrate with the arrangement being such as to when the electrical substrate is placed inserted into the guide channels of the carrier substrate and the contact is made between the electrical connections on the electrical substrate and on the carrier substrate. The connectors employed include a row of pins and connector sockets which have receptacles arranged to accept the associated electrical pins from the other substrate. It will be obvious from the foregoing that direct alignment is required for the pins and pin receptacles to properly mate with each other to provide the appropriate electrical connection between the electrical substrate and the carrier substrate.

SUMMARY OF THE INVENTION

In accomplishing the object of the present invention, there is provided an arrangement for electrically connecting an electrical substrate to a carrier substrate. The electrical substrate of the present invention includes a pair of guide rails each mounted on the perimeter edge of the electrical substrate directly opposite the other. A second pair of guide rails also is located in a spaced relationship from the first pair of guide rails are also mounted on the perimeter edge. Between the guide rails are several slots. On the top of the electrical substrate is mounted a flexible printed circuit which is laminated to the backing material of the electrical substrate. At slots or open sections between the guide rails, the flexible circuit is then bent in a downward direction and secured to the under side of the electrical substrate. The flexible circuit is affixed by means of a compliant material to the bottom of the electrical substrate.

The arrangement is such that when the electrical substrate is placed in contact with the carrier substrate in a manner similar to that taught in my previously referenced patents. The contact portion of the flexible circuit which has been exposed of its insulating material, is in contact with board contacts included on the carrier substrate. In this manner, electrical contact is made. Downward force to insure electrical contact is supplied by guide mounted forcing cams or pads which may be attached in any matter to the guide rails which provide the necessary support of the electrical substrate to the carrier substrate in the manner similar to that disclosed in the previously referenced patents. In this manner, insertion of the electrical substrate in proper position over the carrier substrate provides appropriate electrical contact between the two substrates with only minimum alignment problems as contrasted to that taught in the prior art.

BRIEF DESCRIPTION OF THE DRAWINGS

A better understanding of the present invention may be had from a consideration of the following detailed description taken in conjunction with the accompanying drawings in which.

DESCRIPTION OF THE PREFERRED EMBODIMENT

Figure 1:
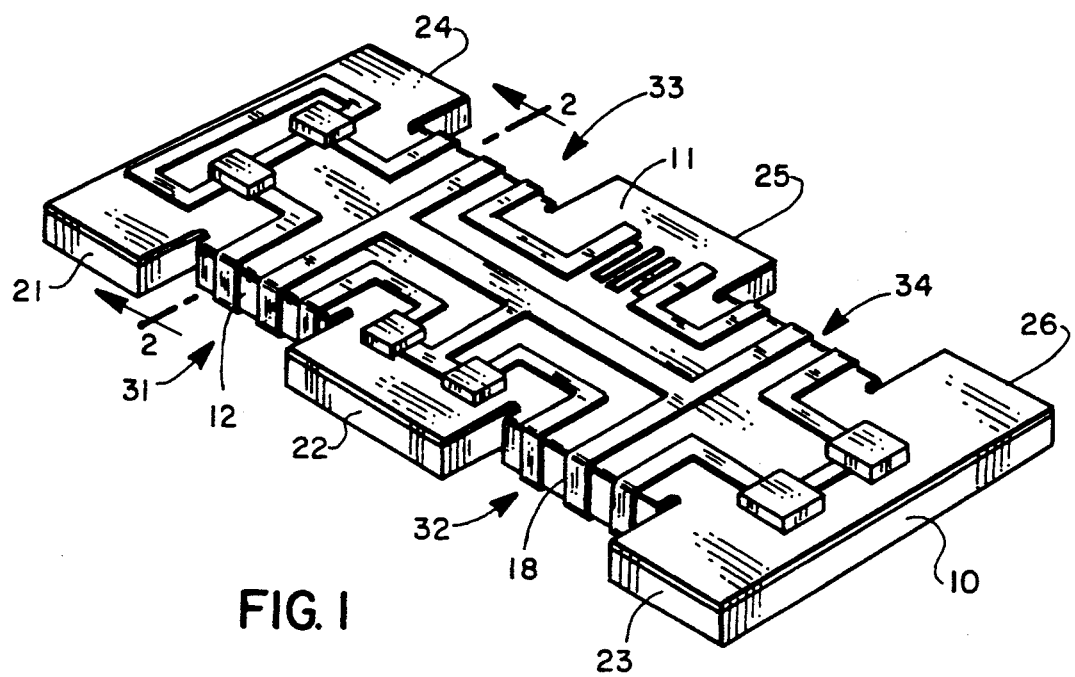
FIG. 1 is a perspective view of an electrical substrate including flexible circuitry mounted thereon.
Figure 2:
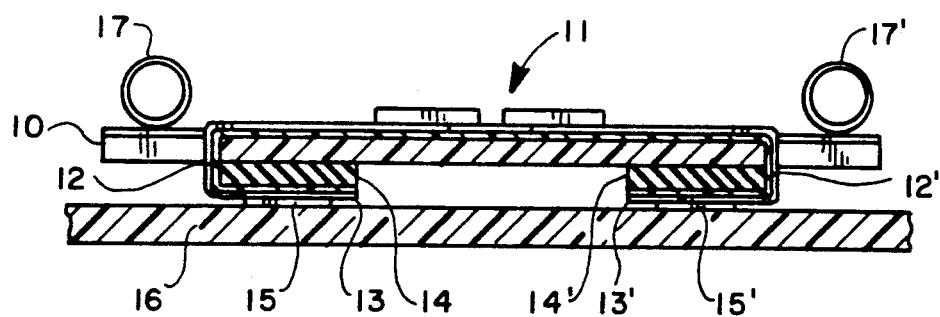
FIG. 2 is a sectional view of the electrical substrate taken along section lines 2—2 of FIG. 1 and a supporting carrier substrate.

Turning now to FIGS. 1 and 2 of the included drawings, the device in accordance with the present invention includes a planar substrate 10 having side rails 21, 22, 23, 24, 25 and 26 mounted onto the substrate 10. Located between the side rails are recesses 31, 32, 33 and 34. Positioned on the top of the electrical substrate is flexible circuit 11. As may be seen in FIG. 1, electrical conductors from the flexible circuit 11 have been exposed and bent in a downward direction at recesses 31 and 32, with connectors 12 and 18 then passing underneath the electrical substrate as may be seen in FIG. 2. Connectors 12' and 18' (not shown) would be comparable connectors in notches 33 and 34. Flexible circuitry is well known in the state of the art and is available from many sources and is similar to those used in telephone substations.

Exposed portions of flexible circuit connectors such as 12 and 13 and 12' and 13' (not shown) are passed underneath electrical substrate 10 and secured to a compliant or flexible backing 14 and 14', respectively. The compliant portion may be double sided adhesive silicon or similar material which provides the necessary compliant backing.

Once the electrical substrate is positioned over the carrier substrate, exposed contacts are brought into contact with board contacts 15 and 15', respectively. Note that the board contacts represent typical contacts that may be found on the carrier substrate 16 and will provide appropriate electrical connection to other circuitry contained on the substrate board or connected thereto.

During initial positioning, the contacts, such as 12 and 12', will slide easily onto board contacts 15 and 15', respectively. Once properly positioned, the top of the electrical substrate will also be forced in the downward position by pads 17 and 17' which act to provide a downward force to electrical 10 substrate to force the flexible circuit contacts 12 and 12' in tight contact with board contacts 15 and 15', respectively. The portion of the guide elements that force the electrical substrate in a downward direction is not shown. Since the details are unimportant it only being required that they provide a reasonable amount of pressure and are attached in any well known manner to the guide channels which are utilized for insertion in holding of the electrical substrate 10 in position on the carrier substrate 16 in a manner similar to that taught in the previously referenced patents. Details of mounting the pressure elements 17 and 17' on the channel guide elements are not important and do not form a portion of the present invention. These units would most probably include some kind of a spring and resiliant action so as to not cause undue pressure but still adequate pressure to maintain contact between the conductors of the flexible circuit and the board contacts as outlined above.

While but a single embodiment of the present invention has been shown, it will be obvious to those skilled in the art that numerous modifications may be made without departing from the spirit of the invention which shall be limited only by the scope of the claims appended hereto.

What is claimed is:

1. In combination an electrical substrate for electrically connecting a flexible printed circuit to a carrier substrate including at least one circuit contact, said electrical substrate comprising:
   a relatively flat rectangular platelike structure having parallel first and second surfaces, connected by a plurality of side surfaces, certain ones of said side surfaces offset from other side surfaces to define at least one recessed area;
   a flexible printed circuit located on said first surface, including at least one extension section depending from said first surface adjacent to one of said side surfaces defining said recessed area, and further extending beneath said second surface;
   whereby in response to placement of said electrical substrate in a predetermined location on a carrier substrate, said flexible printed circuit is electrically connected to said carrier substrate circuit contact.

2. The combination as claimed in claim 1 wherein: said electrical substrate is constructed of rigid electrically insulated material.

3. The combination as claimed in claim 2 wherein: said carrier substrate is constructed of rigid electrically insulated material.

4. The combination as claimed in claim 3 wherein: a compliant backing material between said electrical substrate second surface and the portion of said printed circuit extending beneath said electrical substrate second surface.

5. The combination as claimed in claim 4 wherein: said compliant backing material is constructed of two-sided adhesive silicon material.

6. The combination as claimed in claim 1 wherein: said flexible printed circuit includes a plurality of insulated circuit conductors;
   at least one of said insulated circuit conductors included in said extension section.

7. The combination as claimed in claim 6 wherein: said circuit conductor included in said extension section has the insulation removed.

8. The combination as claimed in claim 1 wherein: at least one pressure pad associated with said carrier substrate positioned to apply pressure against said electrical substrate first surface in a direction to maintain electrical contact between said flexible printed circuit extension section and said carrier substrate circuit contact.

* * * * *